(12) United States Patent
Tseng et al.

(10) Patent No.: US 9,567,207 B2
(45) Date of Patent: Feb. 14, 2017

(54) RECESS WITH TAPERED SIDEWALLS FOR HERMETIC SEAL IN MEMS DEVICES

(71) Applicant: Taiwan Semiconductor Manufacturing Co., Ltd., Hsin-Chu (TW)

(72) Inventors: Lee-Chuan Tseng, New Taipei (TW); Chang-Ming Wu, New Taipei (TW); Shih-Chang Liu, Kaohsiung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/713,287

(22) Filed: May 15, 2015

(65) Prior Publication Data

US 2016/0332867 A1    Nov. 17, 2016

(51) Int. Cl.
*H01L 29/84* (2006.01)
*B81B 7/00* (2006.01)
*B81C 1/00* (2006.01)

(52) U.S. Cl.
CPC ......... *B81B 7/0041* (2013.01); *B81C 1/00293* (2013.01); *B81B 2201/0235* (2013.01); *B81B 2201/0257* (2013.01); *B81B 2201/0264* (2013.01); *B81B 2207/012* (2013.01); *B81C 2201/0112* (2013.01); *B81C 2203/019* (2013.01); *B81C 2203/0145* (2013.01); *B81C 2203/0785* (2013.01)

(58) Field of Classification Search
CPC .............. B81B 3/0005; B81B 2201/0235; B81B 2207/012; B81B 7/0041; B81B 2201/0257; B81B 2201/0264; B81C 1/00984; B81C 2203/0109; B81C 2203/036; B81C 2203/0785; B81C 1/00293; B81C 2201/0112; B81C 2203/0145; B81C 2203/019
USPC .................................................. 257/418, 415
See application file for complete search history.

(56) References Cited

U.S. PATENT DOCUMENTS 7,811,924 B2 * 10/2010 Cui ................... H01L 21/02115
257/522
7,980,828 B1 * 7/2011 Lantz .................... F04B 19/006
417/207

(Continued)

*Primary Examiner* — Tod T Van Roy
*Assistant Examiner* — Vu A Vu
(74) *Attorney, Agent, or Firm* — Eschweiler & Associates, LLC

(57) ABSTRACT

An integrated circuit (IC) device is provided. The IC device includes a first substrate having a frontside and a backside. The backside includes a first cavity extending into the first substrate. A dielectric layer is disposed on the backside of the first substrate, and includes an opening corresponding to the first cavity and a trench extending laterally away from the opening and terminating at a gas inlet recess. A recess in the frontside of the first substrate extends downwardly from the frontside to the dielectric layer. The recess has substantially vertical upper sidewalls which adjoin lower sidewalls which taper inwardly from the substantially vertical sidewalls to points on the dielectric layer which circumscribe the gas inlet recess. A conformal sealant layer is arranged over the frontside of the first substrate, along the substantially vertical upper sidewalls, and along the lower sidewalls. The sealant layer hermetically seals the gas inlet recess.

20 Claims, 11 Drawing Sheets

(56) References Cited

U.S. PATENT DOCUMENTS

2007/0158826 A1\* 7/2007 Sakakibara ........... B81B 7/0064
257/723
2013/0214365 A1\* 8/2013 Schlarmann .......... G01L 9/0042
257/415

\* cited by examiner

RECESS WITH TAPERED SIDEWALLS FOR HERMETIC SEAL IN MEMS DEVICES

BACKGROUND

Micro-electromechanical system (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For many applications, MEMS devices are electrically connected to microprocessors, microcontrollers, or application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
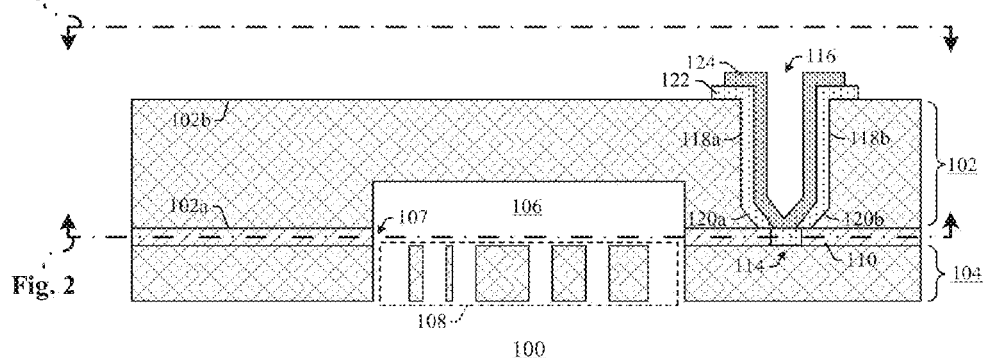
FIG. 1 illustrates a cross-sectional view of a three-dimensional integrated circuit (3D-IC) device made up of a first substrate and a second substrate, where a recess with tapered sidewalls is arranged in a frontside of the first substrate to provide an efficient hermetic seal according to some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application is directed to an improved method for manufacturing a MEMS device that provides a recess with tapered sidewalls to improve hermetic sealing of a cavity in the MEMS device. Since the tapered sidewalls provide an opening with a smaller width than conventional sidewalls, which were purely vertical and not tapered, a sealant layer can be more readily formed over the tapered sidewalls. This simplifies the process for resealing the cavity, and improves yield.

Figure 2:
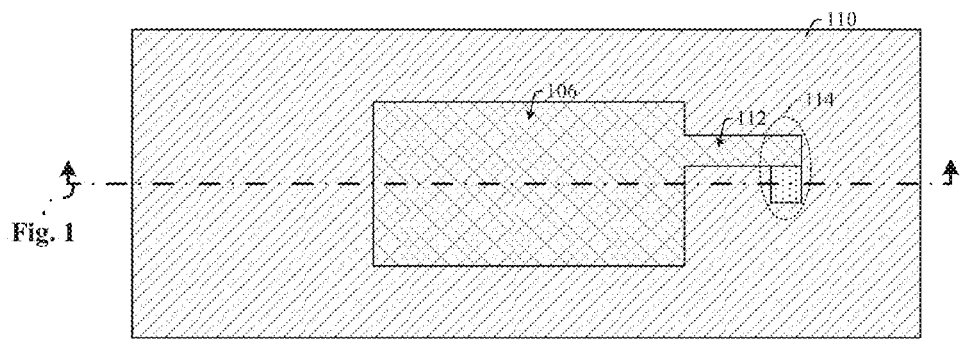
FIG. 2 illustrates a backside view of the first substrate of FIG. 1, as indicated by the sectional lines in FIG. 1 and FIG. 2.
Figure 3:
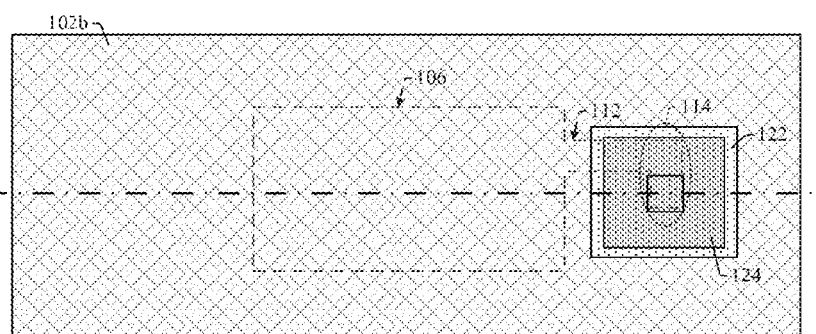
FIG. 3 illustrates a frontside view of the first substrate of FIG. 1, as indicated by the sectional lines in FIG. 1 and FIG. 3.

Referring collectively to FIGS. 1-3, a MEMS 3D-IC structure 100 in accordance with some embodiments is now described. The MEMS 3D-IC 100 is made up of a first substrate 102, which may be referred to in some instances as a capping substrate, and a second substrate 104, which may be referred to in some instances as a MEMS substrate. On a backside 102a of the first substrate 102, a first cavity 106 is disposed. On the second substrate 104, a MEMS device region 108, such as a diaphragm, proof mass, or other flexible or moveable structure, is in fluid communication with the first cavity 106, whereby gaseous molecules within the first cavity 106 can move about and strike the MEMS device region 108. A dielectric layer 110 can optionally be disposed on the backside of the first substrate 102 and separates the first and second substrates 102, 104 from one another.

As shown in FIGS. 1 and 2, if present, the dielectric layer 110 includes an opening 107 corresponding to the first cavity 106 and also includes a trench 112 which extends laterally away from the opening 107 and which terminates at a gas inlet recess 114. If the dielectric layer 110 is not present, the trench 112 and gas inlet recess 114 can alternatively be formed in a portion of the first substrate 102 nearest the backside 102a.

As shown in FIGS. 1 and 3, on the frontside 102b of the first substrate 102, a recess 116 extends downwardly from the frontside 102b to the dielectric layer 110. The recess 116 has substantially vertical upper sidewalls 118a, 118b and tapered lower sidewalls 120a, 120b. Advantageously, the lower sidewalls 120a, 120b taper inwardly from the substantially vertical upper sidewalls 118a, 118b down to points on the dielectric layer 110 which circumscribe the gas inlet recess 114. A conformal sealant layer 122, such as an oxide for example, extends conformally over a portion of the frontside 102b of the first substrate 102, along the substantially vertical upper sidewalls (118a, 118b), along the tapered lower sidewalls (120a, 120b), and down into a portion of the trench 112 to hermetically seal the gas inlet recess 114, and thereby hermetically seal the first cavity 106. By virtue of their tapered character, the lower sidewalls 120a, 120b are more closely spaced nearest the gas inlet recess 114 which allows the conformal sealant layer 122 to provide a more reliable hermetic seal than conventional approaches. A conformal conductive layer 124, such as a conformal aluminum layer, is then formed over the conformal sealant layer 122. As will be appreciated further herein, other configurations for hermetic sealing of cavities by use of recesses with tapered sidewalls are also contemplated as falling within the scope of this disclosure.

Figure 4:
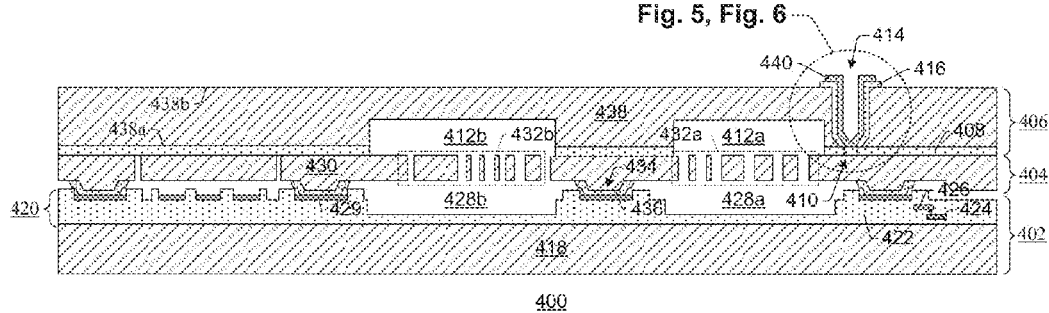
FIG. 4 illustrates a cross-sectional view of another 3DIC device made of first, second, and third substrates, wherein multiple cavities are included in the 3D-IC and wherein pressure is retained in at least one of the cavities by a recess with tapered sidewalls that has been hermetically sealed in accordance with some embodiments.

FIG. 4 shows a MEMS 3D-IC 400 in accordance with some embodiments. The MEMS 3D-IC 400 includes a device IC 402, a MEMS IC 404, and a capping structure 406, which are bonded to one another as shown. A dielectric layer 408 is disposed on a backside of the capping structure 406 and has a gas inlet recess 410 therein. The gas inlet recess 410 is fluidly coupled to a first cavity 412a through a lateral trench in the dielectric layer 408, for example as previously described with regards to FIGS. 1-3.

When the MEMS IC 404 and capping structure 406 are initially bonded together, the MEMS IC 404 and capping structure 406 cooperatively surround the first cavity 412a as well as second cavity 412b such that the first and second cavities 412a, 412b are initially sealed during manufacture to retain a first pressure therein. The first pressure is the same for the first and second cavities 412a, 412b. After this first pressure is initially retained in the cavities 412a, 412b, an etch is carried out to form a recess 414 which exposes the gas inlet opening 410 and thereby re-opens the first cavity 412a, but leaves the second cavity 412b sealed with the first pressure. Advantageously, the recess 414 has tapered sidewalls to promote reliable hermetic sealing. With the gas inlet opening 410 exposed and first cavity 412a re-opened, a conformal sealant layer 416 is formed over the exposed gas inlet opening 410 to hermetically retain a second pressure in the first cavity 412a. The second pressure can be the same or different from the first pressure, which can still be retain in the second cavity 412b.

Although FIG. 4 illustrates only first and second cavities 412a, 412b, this process can be extended to more than two cavities on a 3D-IC and/or on a wafer, such that different cavities can be separately opened and separately sealed by forming a series of recesses and conformal sealant layers. This technique provides an efficient manner of providing multiple MEMS device regions that exhibit respective pressures that can be individually tuned. In some embodiments, at least one cavity (e.g., second cavity 412b in FIG. 4) is initially sealed at the first pressure without corresponding a gas inlet recess in the frontside of the capping structure 406, which can streamline the manufacturing process slightly compared to approaches where each and every cavity has its own gas inlet recess sealed off by its own recess and conformal sealant layer.

In some embodiments, the device IC 402 supports MEMS operations and is, for example, a CMOS IC, such as an application-specific-integrated circuit (ASIC), general purpose processor, or microcontroller, among others. The device IC 402 includes semiconductor devices (such as MOSFET, BJTs, capacitors, resistors, inductors, and/or diodes, for example—not shown), which are arranged in and/or over a device substrate 418. The device substrate 418 may be referred to in some embodiments as a third substrate and may be, for example, a bulk semiconductor substrate, such as a bulk silicon substrate, or a semiconductor on insulator (SOI) substrate.

A back-end-of-line (BEOL) metallization stack 420 is disposed over the device substrate 418 and includes an interlayer dielectric (ILD) layer 422 and metallization layers 424, 426 stacked within the ILD layer 422. The ILD layer 422 may be, for example, a low κ dielectric (i.e., a dielectric with a dielectric constant less than about 3.9) or an oxide. The metallization layers 424, 426 include an upper metallization layer 429 fashioned as an IC bond ring. The IC bond ring laterally surrounds first and second device cavities 428a, 428b, which are recessed relative to an upper surface of the ILD layer 422. Further, in some embodiments, the IC bond ring is disposed in a ring-shaped recess in the ILD layer 422 that leaves an upper surface of the IC bond ring exposed. Contacts (not shown) electrically couple the semiconductor devices to the metallization layers 424, 426; and vias electrically couple the metallization layers 424, 426 to one another. The metallization layers (424, 426), contacts, vias, and the IC bond ring may be, for example, a conductive material, such as aluminum copper, germanium, copper, tungsten, or some other metal.

The MEMS IC 404 is arranged over and bonded to the device IC 402. The MEMS IC 404 includes a MEMS substrate 430, which may be referred to in some embodiments as a second substrate. The MEMS substrate 430 may be, for example, a bulk semiconductor substrate, a SOI substrate, or a polysilicon-on-insulator (POI) substrate. First and second MEMS device regions 432a, 432b corresponding to first and second moveable or flexible structures, respectively, are fashioned from the MEMS substrate 430 and facilitate the MEMS IC 404 functioning as a motion sensor, a pressure sensor, or a microphone, for example. The first and second MEMS device regions 432a, 432b, are arranged over the first and second device cavities 428a, 428b, respectively. In some embodiments, the first and second MEMS device regions 432a, 432b can hermetically separate the first and second device cavities 428a, 428b from the first and second cavities 412a, 412b, respectively, so they retain independent pressures. However, in other embodiments, the first and second MEMS device regions 432a, 432b have openings therethrough so the first and second device cavities 428a, 428b are in fluid communication with the first and second cavities 412a, 412b, respectively (e.g., the first and second MEMS device regions 432a, 432b have the same respective pressures as the first and second device cavities 428a, 428b). A ring-shaped mounting region 434 vertically aligns with the IC bond ring, and is lined by a MEMS bond ring 436. The MEMS bond ring 436 is electrically coupled with the IC bond ring and, in some embodiments, extends into the ring-shaped IC opening in the ILD layer 422. The MEMS bond ring 436 is or otherwise includes, for example, aluminum copper, copper, germanium, tungsten, or some other metal.

Although not shown, in some embodiments, an anti-stiction layer lines surfaces of the cavities 412a, 412b, 428a, 428b, and/or surfaces of the MEMS device regions 432a, 432b. The anti-stiction layer advantageously prevents stiction of the movable or flexible element of the MEMs device region 432a, 432b during operation of the MEMS IC 404. Typically, the anti-stiction layer is a conformal self-assembled monolayer or self-assembled membrane (SAM), but other anti-stiction layers are amenable.

During operation of the MEMS IC 404, the movable or flexible element of the MEMS device regions 432a, 432b deflects in proportion to external stimuli, such as motion or sound waves, applied to the movable or flexible element. As such, the external stimuli can be quantified by measuring the deflection. In some embodiments, the deflection is measured using capacitive coupling between the movable or flexible element and sensing electrodes (not shown) arranged along the recessed surface of the ILD layer 422. In such embodiments, the movable or flexible element may be electrically coupled to the device IC 402 (e.g., through the MEMS bond ring 436).

The capping structure 406 is arranged over and bonded to the MEMS IC 404. The capping structure 406 includes a capping substrate 438, which may be referred to in some embodiments as a first substrate. The capping substrate 438 has a surface that is recessed relative to its backside 438a and that overlies first and second cavities 412a, 412b. The first and second cavities 412a, 412b are vertically aligned with the first and second device cavities 428a, 428b and, in some embodiments, are in fluid communication with the device cavities 428a, 428b (e.g., through the MEMS opening(s)). The capping structure 406 also has recess 414 extending through the capping substrate 438 to the capping dielectric layer 408, laterally adjacent to the first cavity 412a in the illustrated example. The capping substrate 438 may be, for example, a bulk semiconductor substrate or an SOI substrate. The capping dielectric layer 408 spaces the capping substrate 438 from the MEMS IC 404. The capping dielectric layer 408 may be, for example, an oxide, such as silicon dioxide. A conformal conductive layer 440, such as a conformal aluminum layer, is disposed over the conformal sealant layer 416.

Figures 5, 6:
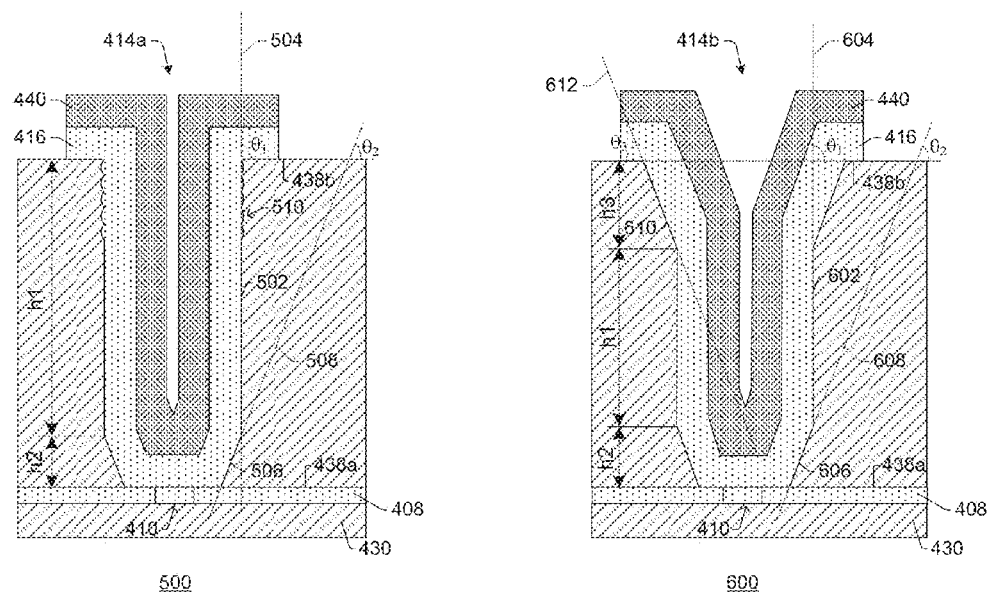
FIG. 5 illustrates an enlarged cross-sectional view of a recess and hermetic seal in accordance with some embodiments.
FIG. 6 illustrates an enlarged cross-sectional view of a recess and hermetic seal in accordance with other embodiments.

With reference to FIG. 5, an enlarged cross-sectional view 500 of some embodiments of the recess 414a and hermetic sealing structure are provided. A substantially vertical upper sidewall 502 lies on a first plane 504, which meets the frontside 438b of the capping substrate 438 at a first angle, $\theta_1$, where $\theta_1$ ranges between eighty-seven-degrees and ninety-three degrees. A tapered lower sidewall 506 lies on a second plane 508 that meets the frontside 438b of the capping substrate 438 at a second angle, $\theta_2$, wherein $\theta_2$ ranges between sixty-degrees and eighty-eight-degrees. The substantially vertical upper sidewall 502 has a first height, $h_1$, measured between the frontside 438b of the capping substrate 438 and a point where the substantially vertical sidewall 502 adjoins the outermost point of tapered lower sidewall 506. This first height, $h_1$, can range between 30 micrometers and 200 micrometers. The tapered lower sidewall 506 can have a second height, $h_2$, which is measured between the outermost point and the backside 438a of the capping substrate 438 and which ranges between 10 micrometers and 50 micrometers. In some embodiments, the substantially vertical sidewalls 502 may exhibit a series of scallops 510 that that are formed by Bosch etching and which can extend along the entire height of the upper sidewalls 502. The scallops are often at approximately regular depths. The conformal sealant layer 416 and conformal conductive layer 440 overlie these sidewalls 502, 506, and extend into the gas inlet recess 410 to hermetically seal the first cavity 412a. Due to the tapered character of the lower sidewalls 506, the conformal sealant layer 416 can be more reliably deposited to provide a more reliable hermetic seal.

With reference to FIG. 6, an expanded cross-sectional view 600 of some alternative embodiments of hermetically sealed recess 414b is provided. A substantially vertical upper sidewall 602 lies on a first plane 604 that meets the frontside 438b of the capping substrate 438 at a first angle, $\theta_1$, wherein $\theta_1$ ranges between eighty-seven-degrees and ninety-three degrees. A tapered lower sidewall 606 lies on a second plane 608 that meets the frontside 438b of the capping substrate 438 at a second angle $\theta_2$, wherein $\theta_2$ ranges between sixty-degrees and eighty-eight-degrees. An upper tapered sidewall 610 lies on a third plane 612 that meets the frontside 438b of the capping substrate 438 at a third angle $\theta_3$ ranging between sixty-degrees and eighty-eight-degrees. The second and third angles, $\theta_2$, $\theta_3$ can be equal to each other, or can differ from one another. In some embodiments, the first height, $h_1$, is about 5~200 um; and the second and third heights, $h_2$ and $h_3$, each range from about 10~50 um and can be the same or different. The conformal sealant layer 416 and conformal conductive layer 440 overlie these sidewalls 602, 606, and 610 and extend into the gas inlet recess 410 to hermetically seal the first cavity 412a. Due to the tapered character of the lower sidewalls 506, the conformal sealant layer 416 can be more reliably deposited to provide a more reliable hermetic seal. Due to the tapered character of the upper sidewalls 610, the conductive layer 440 can be sputtered more reliably to cover the conformal sealant layer 416.

Figure 7:
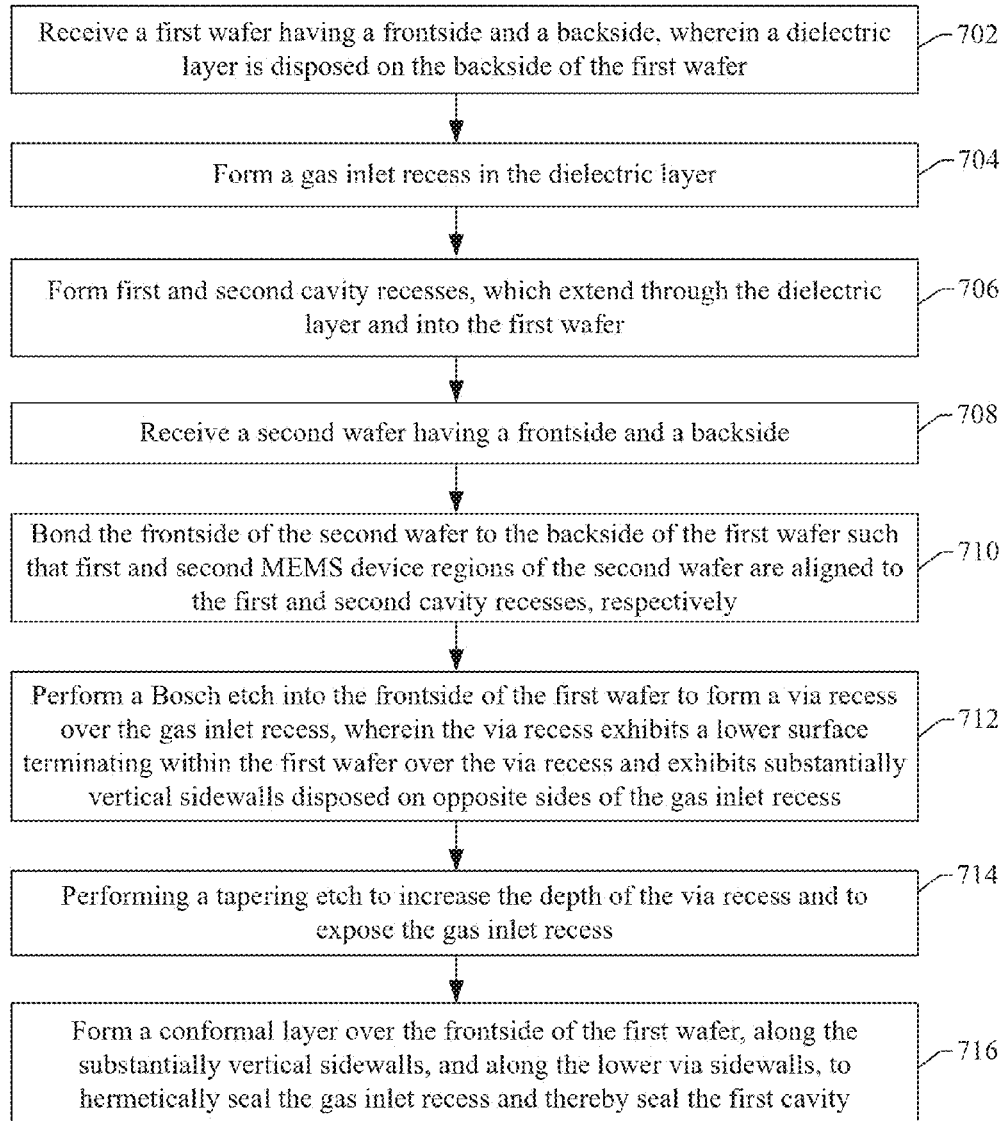
FIG. 7 illustrates a flow chart of some embodiments of a method of manufacturing an integrated circuit device according to aspects of the present disclosure.

With reference to FIG. 7, a flowchart 700 provides some embodiments of a method for manufacturing a MEMS structure, in which a mask layer is used for sealing a cavity.

In 702, a first wafer, which has a frontside and a backside, is received. A dielectric layer is disposed on the backside of the first wafer.

In 704, a gas inlet recess is formed in the dielectric layer.

In 706, first and second cavity recesses are formed. The first and second cavity recesses extend through the dielectric layer and into the first wafer. The first cavity recess can be formed to adjoin the gas inlet recess, and the second cavity recess can be isolated from the gas inlet recess.

In 708, a second wafer, which has a frontside and a backside, is received.

In 710, the frontside of the second wafer is bonded to the backside of the first wafer such that first and second MEMS device regions of the second wafer are aligned to the first and second cavity recesses, respectively. This bonding can initially seal both the first and second cavities recesses with a first gas composition at a first pressure.

In 712, after the first and second wafers have been bonded together, a Bosch etch is carried out. The Bosch etch etches into the frontside of the first wafer to form a via recess over the gas inlet recess. The via recess exhibits a lower surface terminating within the first wafer over the via recess and exhibits substantially vertical sidewalls disposed on opposite sides of the gas inlet recess.

In 714, a tapering etch is performed to increase the depth of the via recess and to expose the gas inlet recess. The tapering etch results in lower via recess sidewalls that taper inwardly from the substantially vertical sidewalls to points on the dielectric layer which are on opposite sides of the gas inlet recess.

In 716, a conformal sealant layer is formed over the frontside of the first wafer, along the substantially vertical sidewalls, and along the lower via sidewalls. This conformal sealant layer hermetically seals the gas inlet recess and thereby seal the first cavity. In this way, the first cavity can be sealed with a second gas composition at a second pressure. The second gas composition can be the same or different from the first gas composition, and the second pressure can be the same or different from the first pressure.

While the disclosed methods (e.g., the method 700 of FIG. 7 and method 2100 of FIG. 21) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 8-20, a series of cross-sectional views of some embodiments of a MEMS structure at various stages of manufacture are provided to illustrate an example consistent with the method of FIG. 7. FIGS. 8-20 illustrate a first example manufacturing flow, while FIGS. 22-29 show a second example manufacturing flow. Although FIGS. 8-20 are described in relation to the method of FIG. 7, it will be appreciated that the structures disclosed in FIGS. 8-20 are not limited to the method, but instead may stand alone as structures independent of the method. Similarly, although the method of FIG. 7 is described in relation to FIGS. 8-20, it will be appreciated that the method is not limited to the structures disclosed in FIGS. 8-20, but instead may stand alone independent of the structures disclosed in FIGS. 8-20 and extends to other non-illustrated structures.

Figure 8:
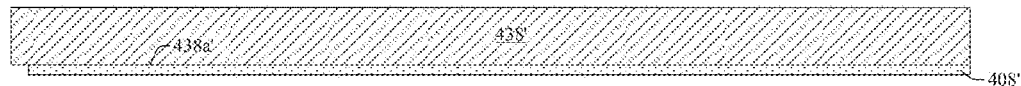
FIGS. 8-20 illustrate a series of incremental manufacturing steps as a series of cross-sectional views, according to the method of FIG. 7.

FIG. 8, which corresponds to some examples of act 702 in FIG. 7, a capping substrate 438' is provided. The capping substrate 438' may be, for example, a bulk semiconductor substrate or a SOI substrate. Further, the capping substrate 438' may have a thickness of, for example, about 160 micrometers to about 200 micrometers, such as about 175 or 180 micrometers. A capping dielectric layer 408' is formed over the capping substrate 438', lining a backside or first surface 438a' of the capping substrate 438'. The capping dielectric layer 408' may be formed using vapor deposition (e.g., chemical vapor deposition (CVD)), thermal oxidation, spin coating, or any other suitable deposition technique. Further, the capping dielectric layer 408' may be formed as, for example, an oxide, such as silicon dioxide.

Figure 9:
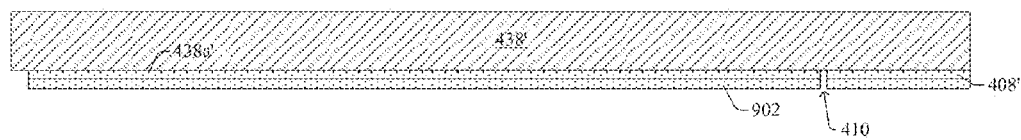

As illustrated by FIG. 9, which can correspond to some examples of act 704 in FIG. 7, first mask layer 902, such as a photoresist mask, is formed over a backside of the capping dielectric layer 408'. A first etch is performed through an opening in the first mask layer 902 to form a trench region and a gas inlet recess 410 in the capping dielectric layer 408'. The trench and gas inlet recess 410 can each have substantially vertical sidewalls that terminate at an interface between the dielectric layer 408' and capping substrate 438', or can stop in either the dielectric layer 408' or the capping substrate 438'. Thereafter, the first mask layer 902 may be removed.

Figure 10:
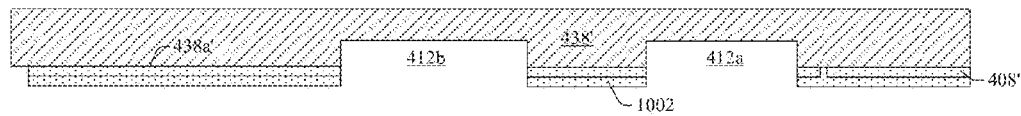

As illustrated by FIG. 10, which can correspond to some examples of act 706 in FIG. 7, a second mask 1002, such as a second photoresist mask, is formed, and a second etch is performed with the second mask 1002 in place to form first and second cavities 412a, 412b. The second etch extends through the capping dielectric layer 408 and into the capping substrate 438'. Further, to the extent that the trench is formed, the first cavity 412a adjoins the trench. Thereafter, the second photoresist layer 1002 may be removed.

Figure 11:
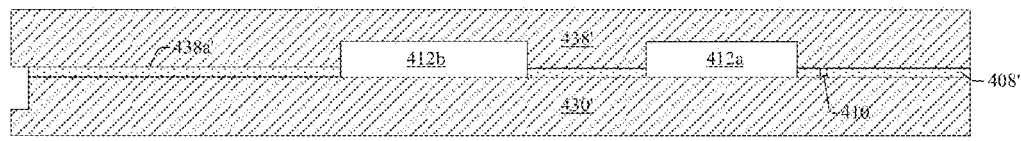

FIG. 11 can correspond to some embodiments corresponding to Acts 708 and 710 of FIG. 7. As illustrated, a second wafer in the form of a MEMS substrate 430' is provided and bonded to the capping substrate 438' through the capping dielectric layer 408'. The bonding seals the first and second cavities 412a, 412b with a first pressure. The process for bonding the MEMS substrate 430' to the capping substrate 438' typically includes a fusion bonding process, but can alternatively include a eutectic bonding process.

Figure 12:
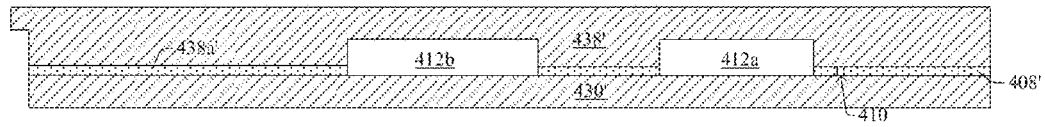

As illustrated by FIG. 12, in some embodiments, a thinning process is performed to reduce a thickness of the MEMS substrate 430'. The thinning process results in a thinner MEMS substrate 430' with a thickness targeted for a MEMS device under manufacture. The thinning process may include, for example, a chemical mechanical polish (CMP) operation.

Figure 13:
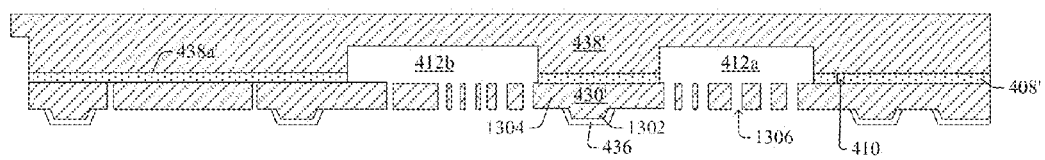

As illustrated by FIG. 13, a third etch is performed into the MEMS substrate 430' to recess the MEMS substrate 430' around a ring-shaped mounting region 1302. The third etch results in a remaining MEMS substrate 430' with a base region 1304 and the ring-shaped mounting region 1302 protruding from the base region 1304. In some embodiments, a width of the ring-shaped mounting region 1302 tapers away from the base region 1304. The process for performing the third etch may include forming a third photoresist layer masking the ring-shaped mounting region 1302. Further, an etchant may be applied to the MEMS substrate 430' according to a pattern of the third photoresist layer. Thereafter, the third photoresist layer may be removed. A MEMS bond ring layer 436 is formed over the base region 1304. The MEMS bond ring layer 436 may be formed using vapor deposition, thermal oxidation, spin coating, or any other suitable deposition technique. However, the MEMS bond ring layer 436 is typically formed conformally. The MEMS bond ring layer 436 may be formed as, for example, a metal, such as aluminum copper or germanium.

As further illustrated by FIG. 13, a fifth etch is optionally performed into the MEMS substrate 430' to form one or more MEMS openings 1306. The MEMS opening(s) 1306 define first and second movable or flexible elements vertically aligned with the first and second capping cavities 412a, 412b. Further, in some embodiments, the MEMS opening(s) 1306 define one or more springs suspending the first and second movable or flexible elements, and/or open the first and second cavities 412a, 412b. The process for performing the fifth etch may include forming a fifth photoresist layer, and applying an etchant to the MEMS substrate according to a pattern of the fifth photoresist layer. Thereafter, the fifth photoresist layer may be removed.

Although not shown, in some embodiments, an anti-stiction layer may be formed lining surfaces of the first and second cavities 412a, 412b, and/or surfaces of the remaining MEMS substrate 430. The anti-stiction layer advantageously prevents stiction of the movable or flexible elements during operation of the MEMS device under manufacture. The anti-stiction layer may be formed as, for example, a conformal SAM.

Figure 14:
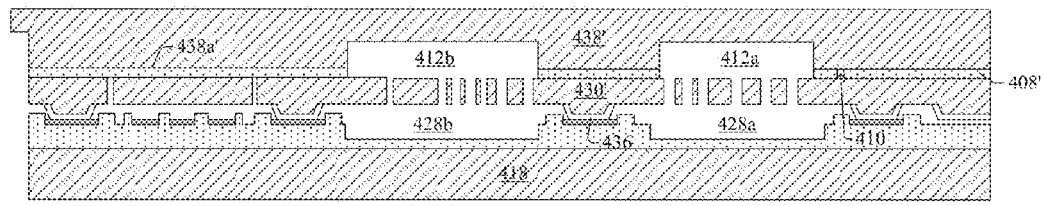

In FIG. 14, a third substrate or wafer 418, which can correspond to an IC substrate or IC wafer made up of multiple IC die, has been bonded to the MEMS substrate 430'. The third substrate or wafer can include first and second device cavities 428a, 428b in a front surface thereof. The third wafer 418 is eutectically bonded to the MEMS substrate 430' through the IC bond ring and the ring-shaped mounting region 1302. The bonding seals the first and second device cavities 428a, 428b and first and second cavities 412a, 412b.

Figure 15:
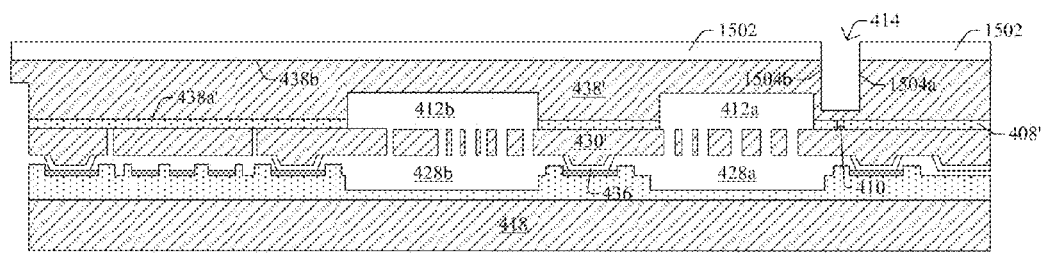

FIG. 15 can correspond to some embodiments corresponding to Act 712 of FIG. 7. As illustrated, a sixth mask layer 1502 is formed over the frontside of the capping substrate 438', and an etch is performed with the sixth mask layer 1502 in place to form a recess 414 in the frontside 438b of the capping substrate 438. The sixth mask layer 1502 may be formed using vapor deposition, thermal oxidation, spin coating, or any other suitable deposition technique. The sixth mask layer 1502 may be formed as, for example, photoresist, a dielectric, such as silicon dioxide, some other oxide, silicon nitride, or some other nitride. Further, the sixth mask layer 1502 may be formed with, for example, a thickness of about 0.1 micrometers to about 5.0 micrometers, such as about 2.4 micrometers. The sixth mask layer 1502 may be removed, or may optionally be left in place.

In some embodiments, the etch to form recess 414 in FIG. 15 is a Bosch etch which alternates repeatedly between two modes to achieve substantially vertical sidewalls 1504*a*, 1504*b*. The first mode uses a nearly isotropic plasma etch, which often includes SiF6:O2 species in a ratio ranging from 1:10 up to 5:1, whose ions attack the capping substrate 438' from a nearly vertical direction. The second mode deposits a chemically inert passivation layer on the sidewalls and bottom surface of the recess 414. For example, $C_4F_8$ (octafluorocyclobutane) source gas deposits a substance similar to Teflon on the sidewalls and bottom surface of the recess 414. The passivation layer tends to protect the capping substrate 438 from further chemical attack from the subsequent plasma etch phase. However, during the subsequent plasma etch phase, the directional ions of the plasma attack the passivation layer at the bottom of the recess 414 (but to a much less extent along the recess sidewalls). Thus, the ions collide with the passivation layer at the bottom of the trench and sputter it off, exposing the bottom of the recess to the chemical etchant. These etch/deposit steps are repeated many times over resulting in a large number of very small isotropic etch steps taking place substantially at the bottom of the etched recess, thereby providing substantially vertical sidewalls 1504*a*, 1504*b* with scallops therein.

Figure 16:
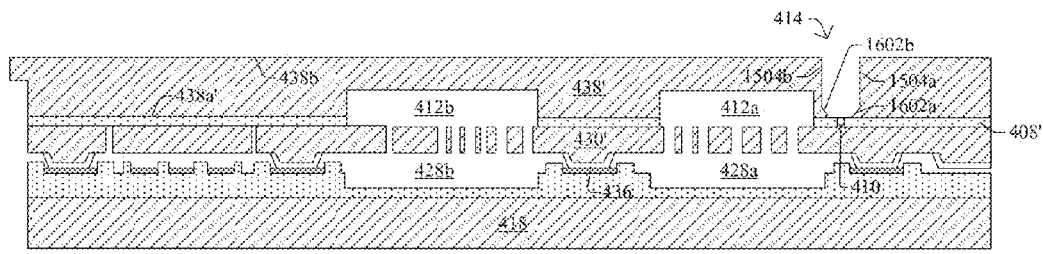

FIG. 16 can correspond to some embodiments corresponding to Act 714 of FIG. 7. In FIG. 16, with the sixth mask 1502 optionally still in place (or optionally removed), a tapering etch is carried out to deepen the recess 414 and taper the substantially vertical sidewalls towards the bottom of the recess 414. In some embodiments, this tapering etch is a steady-state etch, such as a wet etch that selectively etches silicon and leaves silicon dioxide in place. Thus, the tapering etch can remove exposed portions of capping substrate 438' while leaving exposed dielectric layer 408' in place. In other embodiments, other etches can be used, such as an isotropic wet or isotropic dry etch. In some embodiments, a solution of hydrofluoric acid (HF) can be used for this tapering etch. Thus, after the tapering etch, the recess 414 exhibits substantially vertical upper sidewalls 1504*a*, 1504*b*, and tapered lower sidewalls 1602*a*, 1602*b*. The sixth mask 1502 can remain in place after the tapering etch, or can be removed if still present.

Figure 17:
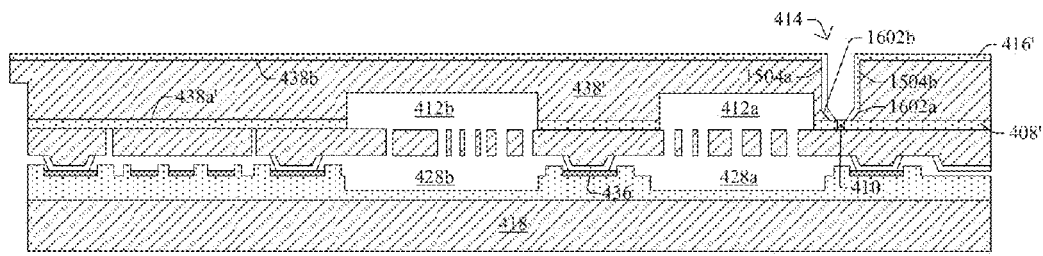

FIG. 17 can correspond to some embodiments corresponding to Act 716 of FIG. 7. As illustrated, a conformal sealant layer 416' is formed over the frontside of the capping substrate 438', along the substantially vertical sidewalls, and along the tapered lower sidewalls to hermetically seal the gas inlet recess and first cavity 412*a*. In some embodiments, the seal layer thickness is formed at about 0.25 micrometers to about 2.5 micrometers. Although FIG. 17 shows the sixth mask 1502 as having been removed prior to the deposition of the conformal sealant layer 416', it will be appreciated that the sixth mask 1502, if left in place, can separate the frontside 438*b* and the conformal sealant layer 416'. The sealant layer 416' may be formed using vapor deposition, thermal oxidation, spin coating, or any other suitable deposition technique, depending upon the target pressure. For a second pressure less than a millibar, a sputter deposition may be used. For a second pressure between about 0.1 torr to about 100 torr, a sub-atmospheric CVD (SACVD) may be used. For a second pressure less than a standard atmosphere (atm), atmospheric pressure CVD (APCVD) may be used.

Figure 18:
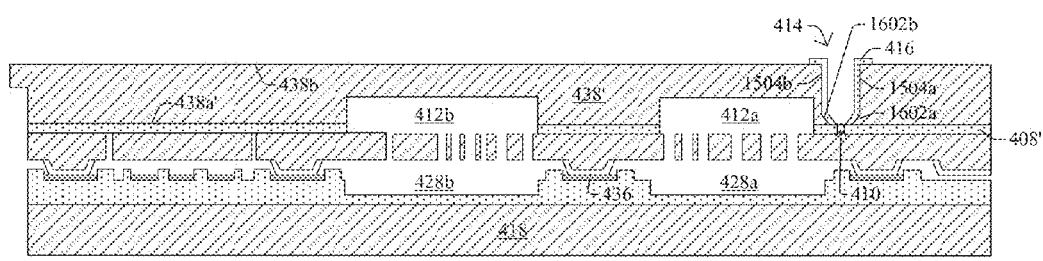

In FIG. 18, a seventh mask (not shown) is formed over the conformal sealant layer 416', and is used to pattern the conformal sealant layer 416'. Thus, with the seventh mask in place, an etch is carried out to remove portions of the conformal sealant layer 416' of FIG. 17, and provide the patterned conformal sealant layer 416 illustrated in FIG. 18.

Figure 19:
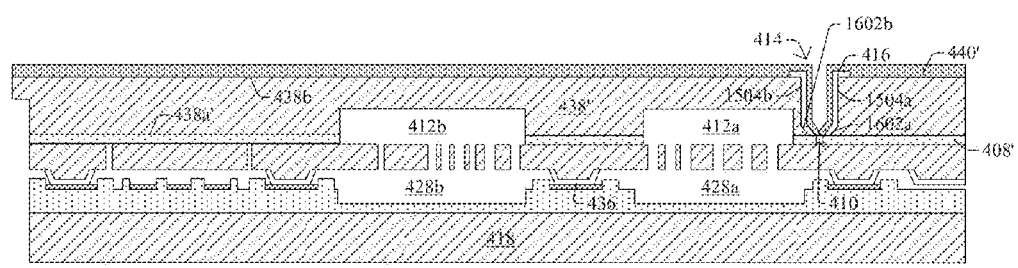

In FIG. 19, a conductive layer 440', such as aluminum, is sputtered over the frontside 438*b* of the capping substrate 438.

Figure 20:
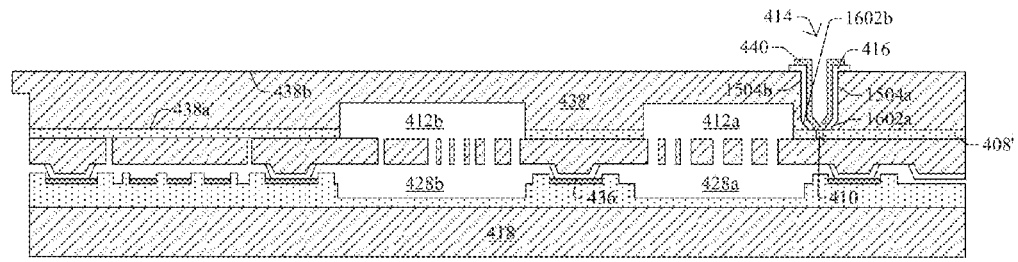

In FIG. 20, an eighth mask (not shown) is formed over the conductive layer 440', and is used to pattern the conformal sealant layer 416. Thus, with the eight mask in place, an etch is carried out to remove portions of the conductive layer 440' of FIG. 19, and provide the patterned conductive layer 440 illustrated in FIG. 20.

Figure 21:
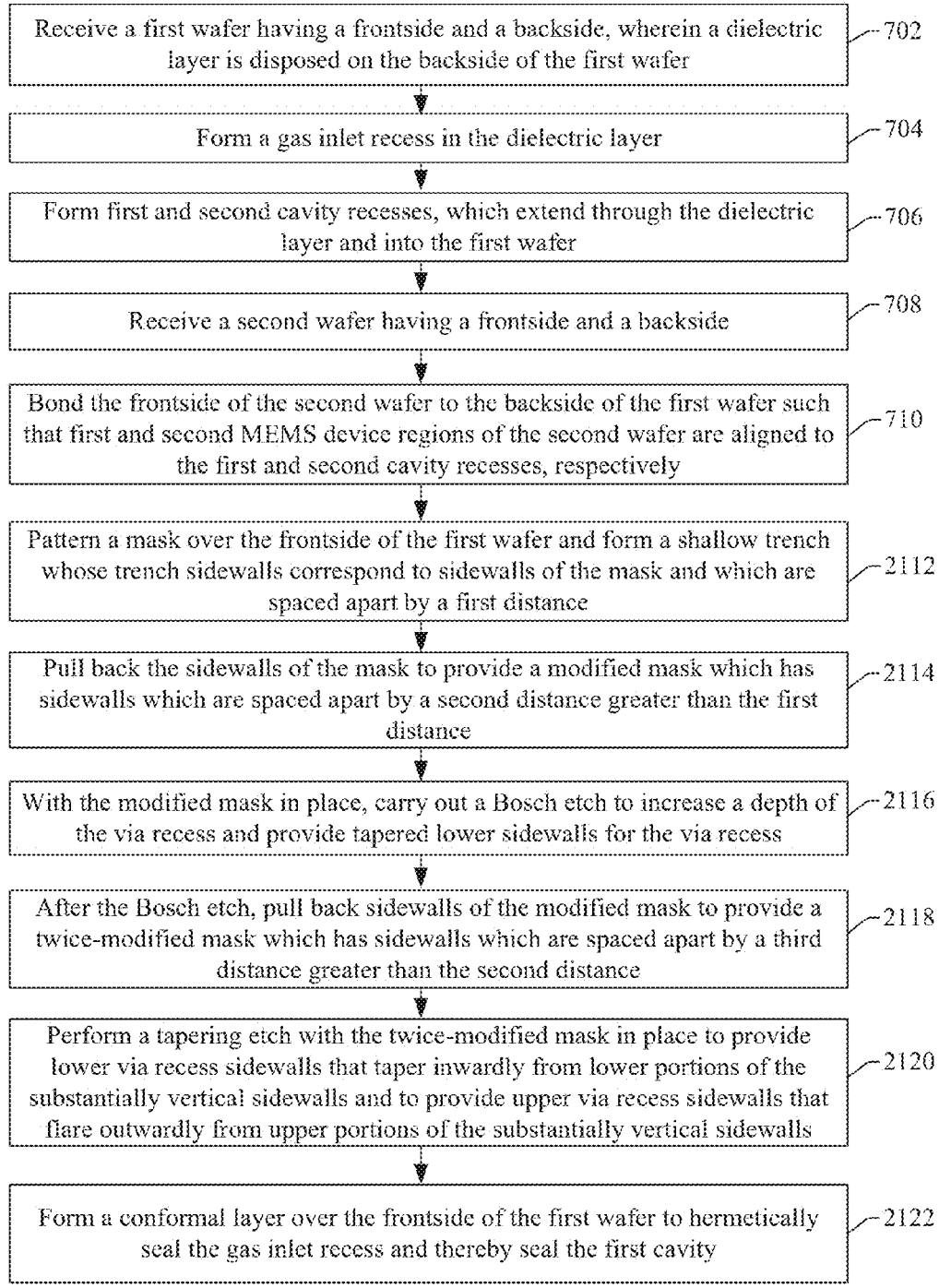
FIG. 21 illustrates a flow chart of some embodiments of a method of manufacturing an integrated circuit device according to aspects of the present disclosure.

FIG. 21 depicts a flowchart 2100 illustrating an alternative method for manufacturing a MEMS structure using a recess with tapered sidewalls. Blocks 702-710 are the same as previously described with regards to FIG. 7, and thus are not reproduced here for sake of brevity. A non-limiting example consistent with blocks 2112-2122 is now described below.

Figure 22:
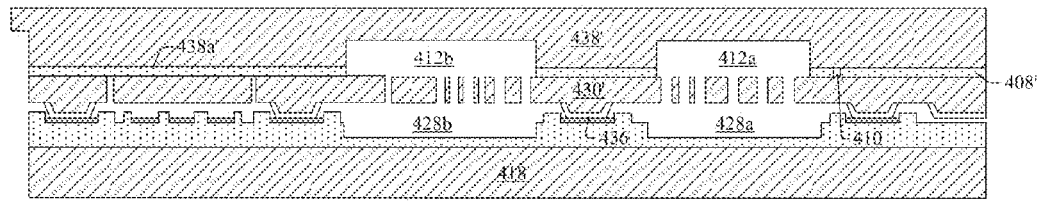
FIGS. 22-29 illustrate a series of incremental manufacturing steps as a series of cross-sectional views, according to the method of FIG. 21.

In FIG. 22, which corresponds to 710 of FIG. 21 (710 was previously described with regard to FIG. 14), a third substrate or wafer 418, which can correspond to an IC substrate or IC wafer made up of multiple IC die, has been bonded to a MEMS substrate 430'. A first substrate 438', in the form of a capping structure, is disposed over the MEMS substrate 430' as previously described.

Figure 23:
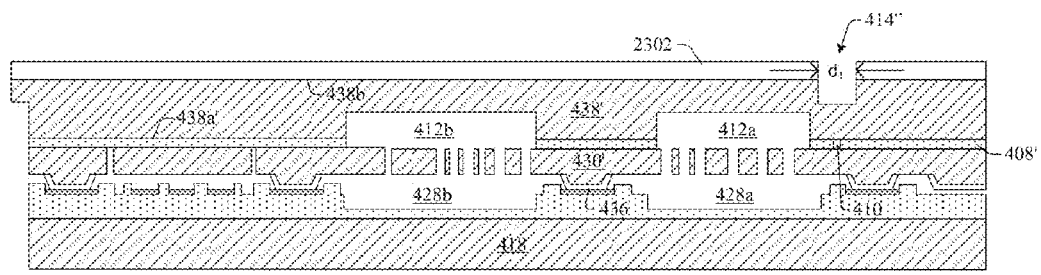

In FIG. 23, which corresponds to an example of 2112 of FIG. 21, a sixth mask layer 2302 is formed over the frontside of the capping substrate 438'. The sixth mask layer 2302 has mask sidewalls separated by a first distance, $d_1$, and an etch is performed with the sixth mask layer 1502 in place to form a recess 414" in the frontside 438*b* of the capping substrate 438. Recess 414" has substantially vertical sidewalls 2304*a*, 2304*b* which are also spaced apart by the first distance $d_1$. The sixth mask layer 2302 may be formed using vapor deposition, thermal oxidation, spin coating, or any other suitable deposition technique. The sixth mask layer 2302 may be formed as, for example, photoresist, a dielectric, such as silicon dioxide, some other oxide, silicon nitride, or some other nitride. Further, the sixth mask layer 2302 may be formed with, for example, a thickness of about 0.1 micrometers to about 5.0 micrometers, such as about 2.4 micrometers.

Figure 24:
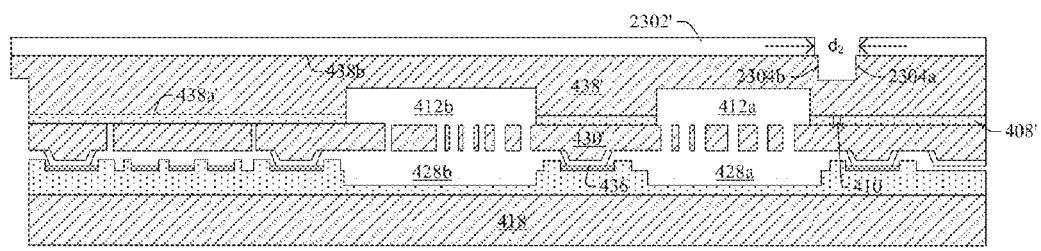

In FIG. 24, which corresponds to 2114 of FIG. 21, the mask sidewalls of the sixth mask 2302 are pulled back to provide a modified mask 2302'. Thus, the modified mask 2302' has mask sidewalls which are spaced apart by a second distance, $d_2$, which is greater than the first distance $d_1$.

Figure 25:
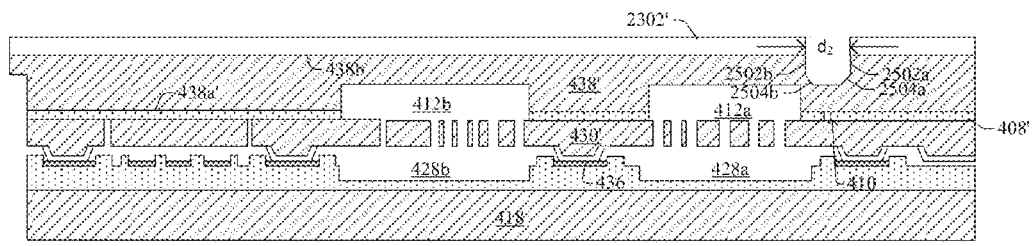

In FIG. 25, which corresponds to 2116 of FIG. 21, with the modified mask 2302' in place, a Bosch etch is carried out to increase a depth of the recess 414". After the Bosch etch, the recess 414" includes substantially vertical sidewalls 2502*a*, 2502*b*, and tapered lower sidewalls 2504*a*, 2504*b*.

Figure 26:
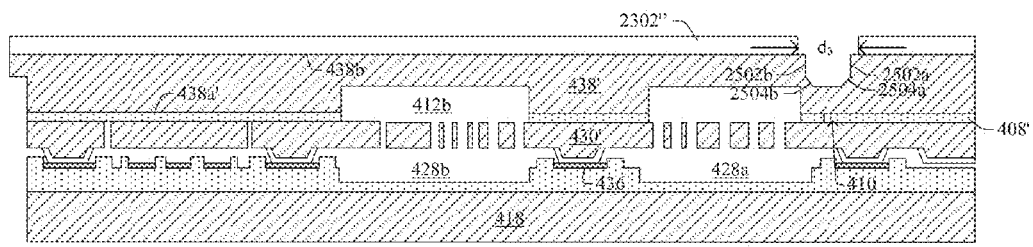

In FIG. 26, which corresponds to 2118 of FIG. 21, after the Bosch etch, mask sidewalls of the modified mask are pulled back to provide a twice-modified mask 2302" which has mask sidewalls spaced apart by a third distance, $d_3$, greater than the second distance, $d_2$.

Figure 27:
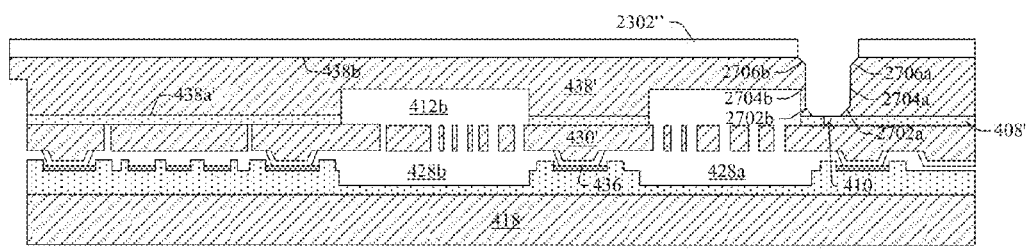

In FIG. 27, which corresponds to 2120 of FIG. 21, a tapering etch is performed. This tapering etch provides tapered lower sidewalls 2702*a*, 2702*b*, that taper inwardly from lower portions of the substantially vertical sidewalls

2704*a*, 2704*b*. The tapering etch also provides upper recess sidewalls 2706*a*, 2706*b* that flare outwardly from upper portions of the substantially vertical sidewalls.

Figure 28:
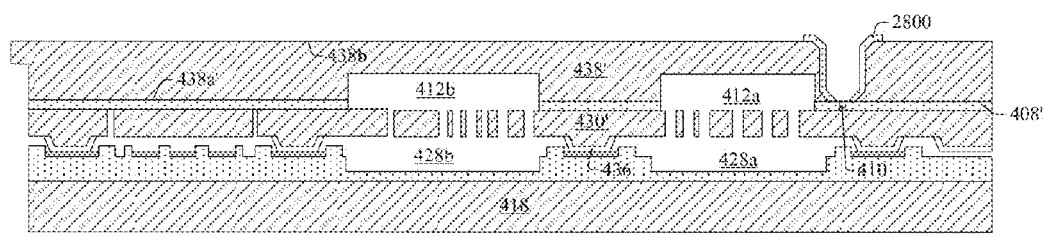

In FIG. 28, which corresponds to 2122 of FIG. 21, a conformal sealant layer 2800 is formed over the frontside of the capping substrate 438' to hermetically seal the gas inlet recess 410 and thereby seal the first cavity 412*a*.

Figure 29:
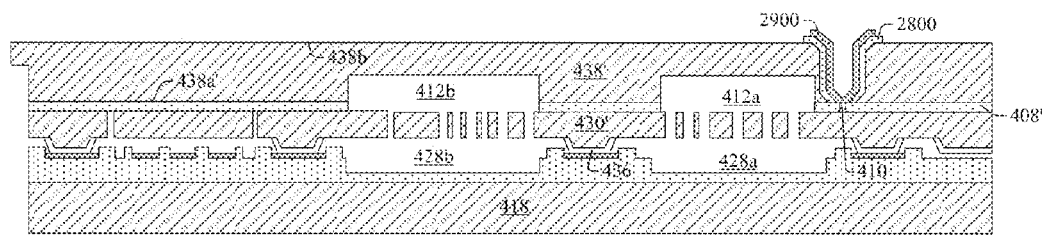

In FIG. 29, a conductive layer 2900 is formed over the sealant layer 2800, for example by sputtering.

Some embodiments relate to an integrated circuit (IC) device. The IC device includes a first substrate having a frontside and a backside. The backside includes a first cavity extending into the first substrate. A dielectric layer is disposed on the backside of the first substrate, and includes an opening corresponding to the first cavity and a trench extending laterally away from the opening and terminating at a gas inlet recess. A recess in the frontside of the first substrate extends downwardly from the frontside to the dielectric layer. The recess has substantially vertical upper sidewalls which adjoin lower sidewalls which taper inwardly from the substantially vertical sidewalls to points on the dielectric layer which circumscribe the gas inlet recess. A conformal sealant layer is arranged over the frontside of the first substrate, along the substantially vertical upper sidewalls, and along the lower sidewalls. The sealant layer hermetically seals the gas inlet recess.

In other embodiments, the present disclosure provides a device. The device includes a CMOS die including a CMOS substrate, a MEMS die including a MEMS substrate and bonded to the CMOS die, and a cap structure including a cap substrate and a dielectric layer on an underside of the cap structure. The dielectric layer includes first and second cavities and a gas inlet recess extending laterally from the first cavity. The dielectric layer of the cap structure is bonded to an upper surface of the MEMS die. A recess has substantially vertical sidewalls, which extend downwardly from an upper surface of the cap structure over the gas inlet recess. The vertical sidewalls meet lower sidewalls which taper inwardly from the substantially vertical sidewalls. The lower sidewalls extend downwardly to an upper surface of the dielectric layer. A conformal oxide layer is disposed over the upper surface of the cap structure, along the substantially vertical sidewalls, and along the lower sidewalls. The conformal oxide layer hermetically seals the gas inlet recess and the first cavity and a first pressure, which is different from a second pressure retained in the second cavity.

Still other embodiments relate to a method of forming an IC (integrated circuit) device. In this method, a first wafer having a frontside and a backside is received. A dielectric layer is disposed on the backside of the first wafer. A gas inlet recess is formed in the dielectric layer, and first and second cavity recesses, which extend through the dielectric layer and into the first wafer, are formed. The first cavity recess is formed to adjoin the gas inlet recess and the second cavity recess is isolated from the gas inlet recess. A second wafer having a frontside and a backside is received, and the frontside of the second wafer is bonded to the backside of the first wafer such that first and second MEMS device regions of the second wafer are aligned to the first and second cavity recesses, respectively. After the first and second wafers have been bonded together, a Bosch etch is performed into the frontside of the first wafer to form a recess over the gas inlet recess. The recess exhibits a lower surface terminating within the first wafer over the gas inlet recess and exhibits substantially vertical sidewalls disposed on opposite sides of the gas inlet recess. A tapering etch is performed to increase a depth of the recess and to expose the gas inlet recess. The tapering etch results in lower recess sidewalls that taper inwardly from the substantially vertical sidewalls to points on the dielectric layer which are on opposite sides of the gas inlet recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device including:
    a first substrate having a frontside and a backside, wherein the backside includes a first cavity extending into the first substrate;
    a dielectric layer disposed on the backside of the first substrate, wherein the dielectric layer includes an opening corresponding to the first cavity and a trench extending laterally away from the opening and terminating at a gas inlet recess;
    a recess in the frontside of the first substrate extending downwardly from the frontside to the dielectric layer, the recess having substantially vertical upper sidewalls which adjoin lower sidewalls which taper inwardly from the substantially vertical sidewalls to points on the dielectric layer which circumscribe the gas inlet recess; and
    a conformal sealant layer over the frontside of the first substrate and along the substantially vertical upper sidewalls, along the lower sidewalls, the conformal sealant layer establishing a plug that hermetically seals the first cavity at the gas recess inlet.

2. The IC device of claim 1, wherein the first cavity retains a first pressure and wherein the backside of the first substrate further comprises:
    a second cavity extending into the first substrate, wherein the second cavity retains a second pressure that differs from a first pressure retained in the first cavity, wherein the second cavity is isolated from the first cavity without a gas inlet recess in the frontside of the first substrate facilitating access to the second cavity.

3. The IC device of claim 1,
    wherein a substantially vertical upper sidewall lies on a first plane that meets the frontside of the first substrate at a first angle ranging between eighty-seven-degrees and ninety-three degrees; and
    wherein a lower sidewall lies on a second plane that meets the frontside of the first substrate at a second angle ranging between sixty-degrees and eighty-eight-degrees.

4. The IC device of claim 1, further comprising:
    upper tapered sidewalls that taper outwardly from upper portions of the substantially vertical sidewalls nearest the frontside of the first substrate.

5. The IC device of claim 4,
    wherein a substantially vertical sidewall lies on a first plane that meets the frontside of the first substrate at a first angle ranging between eighty-seven-degrees and ninety-three degrees;

wherein a lower sidewall lies on a second plane that meets the frontside of the first substrate at a second angle ranging between sixty-degrees and eighty-eight-degrees; and wherein an upper tapered sidewall lies on a third plane that meets the frontside of the first substrate at a third angle ranging between sixty-degrees and eighty-eight-degrees.

6. The IC device of claim 5, wherein the second and third angles are different.

7. The IC device of claim 5, wherein the second and third angles equal.

8. The IC device of claim 1,
wherein a height of a substantially vertical sidewall measured between the frontside of the first substrate and a point where the substantially vertical sidewall adjoins a tapered sidewall ranges between 30 micrometers and 200 micrometers, and
wherein a height of the tapered sidewall as measured between the point and the backside of the first substrate ranges between 10 micrometers and 50 micrometers.

9. The IC device of claim 1:
wherein the conformal sealant layer is a conformal oxide layer, and further comprising:
a conformal aluminum layer disposed in the recess over the conformal oxide layer.

10. The IC device of claim 1, further comprising:
a second substrate bonded to a backside of the dielectric layer on the first substrate such that a frontside of the second substrate covers the gas inlet recess and such that a MEMS device region of the second substrate is aligned with the first cavity; and
a third substrate bonded to a backside of the second substrate, wherein the third substrate includes a third cavity aligned to the MEMS region.

11. A device, comprising:
a CMOS die including a CMOS substrate;
a MEMS die including a MEMS substrate and bonded to the CMOS die;
a cap structure including a cap substrate and a dielectric layer on an underside of the cap structure, wherein the dielectric layer includes first and second cavities and a gas inlet recess extending laterally from the first cavity, the dielectric layer of the cap structure bonded to an upper surface of the MEMS die;
a recess having substantially vertical sidewalls which extend downwardly from an upper surface of the cap structure over the gas inlet recess and which meet lower sidewalls which taper inwardly from the substantially vertical sidewalls, wherein the lower sidewalls extend downwardly to an upper surface of the dielectric layer; and
a conformal oxide layer over the upper surface of the cap structure, along the substantially vertical sidewalls, and along the lower sidewalls, wherein the conformal oxide layer spans the gas inlet recess and seals the first cavity at a first predetermined pressure, which is different from a second predetermined pressure retained in the second cavity.

12. The device of claim 11, wherein the recess includes:
a lower tapered sidewall that tapers inwardly from a lower portion of a substantially vertical sidewall; and
an upper tapered sidewall that flares outwardly from an upper portion of the substantially vertical sidewall.

13. A method of forming an IC (integrated circuit) device, the method comprising:

receiving a first wafer having a frontside and a backside, wherein a dielectric layer is disposed on the backside of the first wafer;
forming a gas inlet recess in the dielectric layer;
forming first and second cavities, which extend through the dielectric layer and into the first wafer, wherein the first cavity is formed to adjoin the gas inlet recess and the second cavity is isolated from the gas inlet recess;
receiving a second wafer having a frontside and a backside;
bonding the frontside of the second wafer to the backside of the first wafer such that first and second MEMS device regions of the second wafer are aligned to the first and second cavities, respectively;
after the first and second wafers have been bonded together, performing a Bosch etch into the frontside of the first wafer to form a recess over the gas inlet recess, wherein the recess exhibits a lower surface terminating within the first wafer over the gas inlet recess and exhibits substantially vertical sidewalls disposed on opposite sides of the gas inlet recess; and
performing a tapering etch to increase a depth of the recess and to expose the gas inlet recess, wherein the tapering etch results in lower recess sidewalls that taper inwardly from the substantially vertical sidewalls to points on the dielectric layer which are on opposite sides of the gas inlet recess.

14. The method of claim 13, further comprising:
forming a conformal layer over the frontside of the first wafer, along the substantially vertical sidewalls, and along the lower sidewalls to hermetically seal the gas inlet recess and thereby seal the first cavity.

15. The method of claim 14, wherein bonding the first and second wafers seals both the first and second cavities at an initial pressure, and wherein forming the conformal layer re-seals the first cavity at a subsequent pressure different from the initial pressure while the second cavity remains at the initial pressure.

16. The method of claim 14, further comprising:
bonding a third wafer to a backside of the second wafer, wherein the third wafer includes a cavity recess which is aligned to the MEMS device region.

17. The method of claim 13,
wherein a substantially vertical sidewall of the recess lies on a first plane that meets the frontside of the first wafer at a first angle ranging between eighty-seven degrees and ninety-three degrees; and
wherein a tapered sidewall of the recess lies on a second plane that meets the frontside of the first wafer at a second angle ranging between sixty-degrees and eighty-eight-degrees;
wherein a substantially vertical sidewall height measured between the frontside of the first wafer and a point where the substantially vertical sidewall meets the tapered sidewall ranges between 30 micrometers and 200 micrometers, and
wherein a tapered sidewall height measured between the point and the backside of the first wafer ranges between 10 micrometers and 50 micrometers.

18. The method of claim 13, wherein the tapering etch comprises a hydrofluoric acid etch.

19. The method of claim 13, further comprising:
prior to performing the Bosch etch, patterning a mask over the frontside of the first wafer and forming a shallow trench whose trench sidewalls correspond to sidewalls of the mask and which are spaced apart by a first distance;

pulling back the sidewalls of the mask to provide a modified mask which has sidewalls which are spaced apart by a second distance greater than the first distance; and with the modified mask in place, carrying out the Bosch etch to increase a depth of the recess provide tapered lower sidewalls for the recess.

20. The method of claim 19, further comprising:

after the Bosch etch, pulling back sidewalls of the modified mask to provide a twice-modified mask which has sidewalls which are spaced apart by a third distance greater than the second distance; and carrying out the tapering etch with the twice-modified mask in place to provide lower recess sidewalls that taper inwardly from lower portions of the substantially vertical sidewalls and upper recess sidewalls that flare outwardly from upper portions of the substantially vertical sidewalls.

\* \* \* \* \*